(12) United States Patent
Kawamori et al.

(10) Patent No.: US 8,179,642 B2
(45) Date of Patent: May 15, 2012

(54) MAGNETORESISTIVE EFFECT ELEMENT IN CPP STRUCTURE AND MAGNETIC DISK DEVICE

(75) Inventors: Keita Kawamori, Tokyo (JP); Yoshihiro Tsuchiya, Tokyo (JP); Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 350 days.

(21) Appl. No.: 12/585,677

(22) Filed: Sep. 22, 2009

(65) Prior Publication Data

US 2011/0069417 A1 Mar. 24, 2011

(51) Int. Cl.
*G11B 5/39* (2006.01)
(52) U.S. Cl. ....................................... 360/319
(58) Field of Classification Search ............ None
See application file for complete search history.

(56) References Cited

U.S. PATENT DOCUMENTS

| 5,549,978 | A | 8/1996 | Iwasaki et al. |
| 7,035,062 | B1 * | 4/2006 | Mao et al. ............ 360/324.2 |
| 7,397,637 | B2 * | 7/2008 | Gill ..................... 360/324.12 |
| 2005/0237677 | A1 | 10/2005 | Shimazawa et al. |
| 2008/0170334 | A1 * | 7/2008 | Otagiri .................... 360/313 |
| 2009/0034132 | A1 | 2/2009 | Miyauchi et al. |
| 2009/0135529 | A1 | 5/2009 | Shimazawa et al. |
| 2009/0180217 | A1 * | 7/2009 | Chou et al. ............... 360/324 |

FOREIGN PATENT DOCUMENTS

| JP | A-H05-073877 | 3/1993 |
| JP | A-2007-109807 | 4/2007 |
| JP | A-2008-097700 | 4/2008 |

* cited by examiner

*Primary Examiner* — Mark Blouin
(74) *Attorney, Agent, or Firm* — Posz Law Group, PLC

(57) ABSTRACT

An MR element in a CPP structure includes an MR part configured with a nonmagnetic layer, a first ferromagnetic layer that functions as first free layer and a second ferromagnetic layer that functions as a second free layer, and first and second ferromagnetic layers are laminated to sandwich the nonmagnetic intermediate layer, and a sense current flows in a lamination direction of the MR part, an orthogonalizing bias function part, which influences a substantial orthogonalization function for magnetization directions of the first ferromagnetic layer and the second ferromagnetic layer, is formed on the rear side the MR part, side shield layers are disposed on both sides in the width direction of the MR part, the side shield layers are perpendicular magnetized layers with a magnetic shield function, and magnetization directions of the perpendicular magnetized layers are in an orthogonal direction that corresponds to the thickness direction.

13 Claims, 12 Drawing Sheets

MAGNETORESISTIVE EFFECT ELEMENT IN CPP STRUCTURE AND MAGNETIC DISK DEVICE

BACKGROUND OF THE INVENTION

1. Field of the Invention

The present invention relates to a magnetoresistive effect element (MR element) in a current perpendicular to plane (CPP) structure that detects magnetic field intensity as a signal from a magnetic recording medium, and so on, a thin film magnetic head with the MR element, and a head gimbal assembly and a magnetic disk device that have the thin film magnetic head.

2. Description of Related Art

In recent years, with an increase in the high recording density of magnetic disk drives (HDD), there have been growing demands for improvements in the performance of thin film magnetic heads. For a thin film magnetic head, a composite type thin film magnetic head has been widely used; it has a structure where a reproducing head having a read-only magnetoresistive effect element (hereinafter, magneto-resistive (MR) element) and a recording head having a write-only induction type magnetic conversion element are laminated together.

As a reproducing head, an MR element having a so-called current in plane (CIP) structure has widely been used. The MR element operates by allowing an electric current to flow in parallel with the film surface of an element referred to as a spin valve GMR element having a CIP structure (CIP-GMR element). The spin valve GMR element having such a structure is placed between upper and lower shield layers formed of soft magnetic metal films in a manner of being sandwiched between insulating layers referred to as gap layers. The recording density in the bit direction is decided by a gap (i.e., a shield gap or read gap length) between the upper and lower shield layers.

As the recording density increases, there is an increasing need for a narrower shield gap and track in a reproducing element of a reproducing head. As a result of the narrower track of the reproducing element and the reduction in the height of the element associated therewith, the area of the element decreased. A problem existed that the operating current was limited in the conventional structure in terms of reliability because the heat dissipating efficiency decreased as the area decreased.

In order to solve the above-mentioned problem, a GMR element having a current perpendicular to plane (CPP) structure (CPP-GMR element) has been proposed. The CPP-GMR element does not need an insulating layer between upper and lower shield layers (i.e., the upper part shield layer and the lower part shield layer) through electrically connecting the upper and lower shield layers to an MR element in series. This technology is essential to achieve a high recording density that exceeds 200 Gbits/in$^2$.

The CPP-GMR element has a lamination structure containing a first ferromagnetic layer and a second ferromagnetic layer formed in a manner of sandwiching a conductive nonmagnetic intermediate layer from both sides. The typical spin valve type CPP-GMR element has a lamination structure from the substrate side sequentially as follows: a lower electrode, an antiferromagnetic layer, a first ferromagnetic layer, a conductive nonmagnetic intermediate layer, a second ferromagnetic layer and an upper electrode.

A magnetization direction of the first ferromagnetic layer, which is one of the ferromagnetic layers, is pinned in the perpendicular direction to a magnetization direction of the second ferromagnetic layer when the externally applied magnetic field is zero. The magnetization of the first ferromagnetic layer can be pinned by making an antiferromagnetic layer adjacent thereto and providing unidirectional anisotropic energy (also referred to as "exchange bias" or "coupled magnetic field") to the first ferromagnetic layer by means of exchange-coupling between the antiferromagnetic layer and the first ferromagnetic layer. For this reason, the first ferromagnetic layer is also referred to as a magnetic pinned layer. On the other hand, the second ferromagnetic layer is referred to as a free layer. Moreover, the structure of the magnetic pinned layer (i.e., the first ferromagnetic layer) having a three-layer structure of a ferromagnetic layer/a nonmagnetic metal layer/a ferromagnetic layer (so-called "a synthetic ferrimagnetic (SyF) structure" or "a synthetic pinned structure") allows not only providing strong exchange-coupling between the two ferromagnetic layers and effectively increasing the exchange-coupling force applied from the antiferromagnetic layer but also decreasing the influence of a static magnetic field generated from the magnetic pinned layer toward the free layer. Therefore, the "synthetic pinned structure" has widely been used lately.

Nevertheless, there remains a need for further thinning an MR element in order to meet the recent demand for extra high recording density. In such circumstances, novel GMR element structures have been proposed that have a simple three-lamination layer structure of a ferromagnetic layer (free layer)/a nonmagnetic intermediate layer/a ferromagnetic layer (free layer) as a basic structure as disclosed in U.S. Pat. Nos. 7,019,371 B2, 7,035,062 B1, and 7,177,122 B2, etc.

In this application, such a structure is conveniently referred to as a dual free layer (DFL) element structure. In the DFL element structure, magnetization directions of two ferromagnetic layers (free layers) are exchange-coupled in a manner of being antiparallel to each other. Moreover, a magnet is disposed on a posterior area opposite to an air bearing surface (ABS), which corresponds to an opposing medium surface of an element, and a predetermined state is created using an influence of a bias magnetic field generated from the magnet in which each magnetization direction of the two magnetic layers (free layers) tilts about 45 degrees relative to the track width direction (initial state).

At a time when an element in the initial magnetization state detects a signal magnetic field from a medium, the magnetization directions of the two magnetic layers change in a scissor-like action like a pair of scissors cuts paper. As a result, a resistance value of the element changes.

The application of such the DFL element structure to a so-called tunneling magnetoresistance (TMR) element or CPP-GMR element allows more narrowing of the "read gap length," a gap between upper and lower shield layers, compared with a conventional general-type spin valve type CPP-GMR element. More specifically, the above-mentioned antiferromagnetic layer that is required for a general spin valve type CPP-GMR element is no longer needed. Nor is the ferromagnetic layer of the above-mentioned "synthetic pinned structure" needed any longer. As a result, it is possible to reduce the "read gap length," the limit of which is conventionally believed to be 30 nm, to 20 nm or less.

In this DFL element structure, since the read gap length can be narrowed, it is possible that a high recording density in the track direction is realized. It is necessary that a high recording density in the track width direction is realized as well to provide an overall high recording density. The technology that enables narrowing of the width (in the track width direction) of an MR element itself has been developed. However, with respect to the high recording density of 660 Gbpsi or more in the future, even though the width of the MR element is narrowed, there was an indication that the substantial reading width is hard to be narrowed. When the conventional technology is used, the photo-width (or width of a pattern made with a photoresist) of 20 nm or less is required and it is very hard to manufacture in view of the process technology.

In consideration of the situation mentioned above, it is possible that side shield layers are formed at both sides of an element in the element width direction. Since, fortunately, a bias magnet, which makes magnetization directions of two free layers orthogonal each other, is provided in the rear side of the element in the above DFL structure, it is possible to arrange the side shield layers at both sides of the element in the element width direction. However, when the side shield layers are simply formed at the both sides of the element in the element width direction, a magnetic field in a cross direction to the element is applied due to a signal magnetic field from an adjacent track next to a primary track to be reproduced. When the magnetic field in the cross direction to the element (mainly the recording magnetic field of the adjacent track) is applied to the DFL element structure, a magnetization direction regulation state (an initial magnetization direction state tilting about 45 degrees relative to the track width direction (initial state)) of the two free layers is broken, i.e., a behavior balance is broken, and there is a possibility that the DFL element cannot operate properly.

In consideration of the situation described above, the present invention is provided. An object of the present invention is to provide an MR element realizing a further high density in the track width direction through the side shield effect while the magnetization direction regulation state of two free layers is held in the normal one in the so-called DFL element structure.

SUMMARY OF THE INVENTION

In order to solve the above-mentioned problems, a magnetoresistive effect element (MR element) of the present invention in a current perpendicular to plane (CPP) structure includes a magnetoresistive effect part (MR part) configured with a nonmagnetic layer, a first ferromagnetic layer that functions as first free layer and a second ferromagnetic layer that functions as a second free layer, and first and second ferromagnetic layers are laminated to sandwich the nonmagnetic intermediate layer, and a sense current flows in a lamination direction of the MR part, an orthogonalizing bias function part, which influences a substantial orthogonalization function for magnetization directions of the first ferromagnetic layer and the second ferromagnetic layer, is formed on the rear side the MR part, side shield layers are disposed on both sides in the width direction of the MR part, the side shield layers are perpendicular magnetized layers with a magnetic shield function, and magnetization directions of the perpendicular magnetized layers are in an orthogonal direction that corresponds to the thickness direction.

As a preferred embodiment of the present invention, the perpendicular magnetized layers are configured to include Co and Ni.

As a preferred embodiment of the present invention, the perpendicular magnetized layers are configured to include Co, Ni and Fe.

As a preferred embodiment of the present invention, the perpendicular magnetized layers are formed with the multiple-layer structure in which a $Co_xFe_{100-X}$ layer (here, $80 \leq x \leq 100$) and a $Ni_yFe_{100-y}$ layer (here, $80 \leq y \leq 100$) are alternatively laminated as a lamination layer.

As a preferred embodiment of the present invention, the perpendicular magnetized layers are formed with the multiple-layer structure in which a $CO_xFe_{100-X}$ layer (here, $80 \leq x \leq 100$) and a $Ni_yFe_{100-y}$ layer (here, $80 \leq y \leq 100$) are alternatively laminated as a lamination layer, and when a layer thickness of the $Co_xFe_{100-X}$ layer is t1, and a layer thickness of the $Ni_yFe_{100-y}$ layer is t2, a thickness ratio satisfies the following expression: $1.5 \leq t2/t1 \leq 2.5$.

As a preferred embodiment of the present invention, when the influence from the orthogonalizing bias function part is eliminated, the magnetization directions of the first ferromagnetic layer and the second ferromagnetic layer are antiparallel to each other in the width direction.

As a preferred embodiment of the present invention, the first ferromagnetic layer is formed before the second ferromagnetic layer is formed and is disposed on the lower side, a lower antiferromagnetic layer, a lower exchange-coupling shield layer, a lower antiferromagnetic layer, and a lower shield layer are sequentially formed toward the bottom under the first ferromagnetic layer, and an upper antiferromagnetic layer, an upper exchange-coupling shield layer, an upper antiferromagnetic layer, and an upper shield layer are sequentially formed toward the top above the second ferromagnetic layer.

A thin film magnetic head of the present invention includes an air bearing surface (ABS) that is opposite to a recording medium, the magnetoresistive effect element (MR element) discussed above that is provided in the vicinity of the ABS to detect a signal magnetic field from the recording medium, and a pair of electrodes that apply an electric current in the lamination direction of the MR element.

A head gimbal assembly of the present invention includes a slider having the thin film magnetic head discussed above and being provided opposite to the recording medium, and a suspension elastically supporting the slider.

A magnetic disk device of the present invention includes a slider having the thin film magnetic head discussed above and being provided opposite to the recording medium, and a positioning device supporting the slider and locating a position of the slider with respect to the recording medium.

EXPLANATION OF THE PREFERRED EMBODIMENT

The best mode for implementing the present invention will be described in detail hereafter.

In the explanation below, the X axis direction is defined as "width," the Y axis direction is defined as "length," and the Z axis direction is defined as "thickness" in each drawing.

In the Y axis direction, an area that is close to an ABS (an opposing medium surface) is defined as "front," and an area that is opposite to the front is defined as "rear (or posterior)." The laminating up direction of an element is defined as "above" or "upper side," and the opposite direction is defined as "below" or "lower side."

An MR element according to the present invention adapts the DFL element structure in which two free layers exist via a nonmagnetic intermediate layer.

Figure 1:
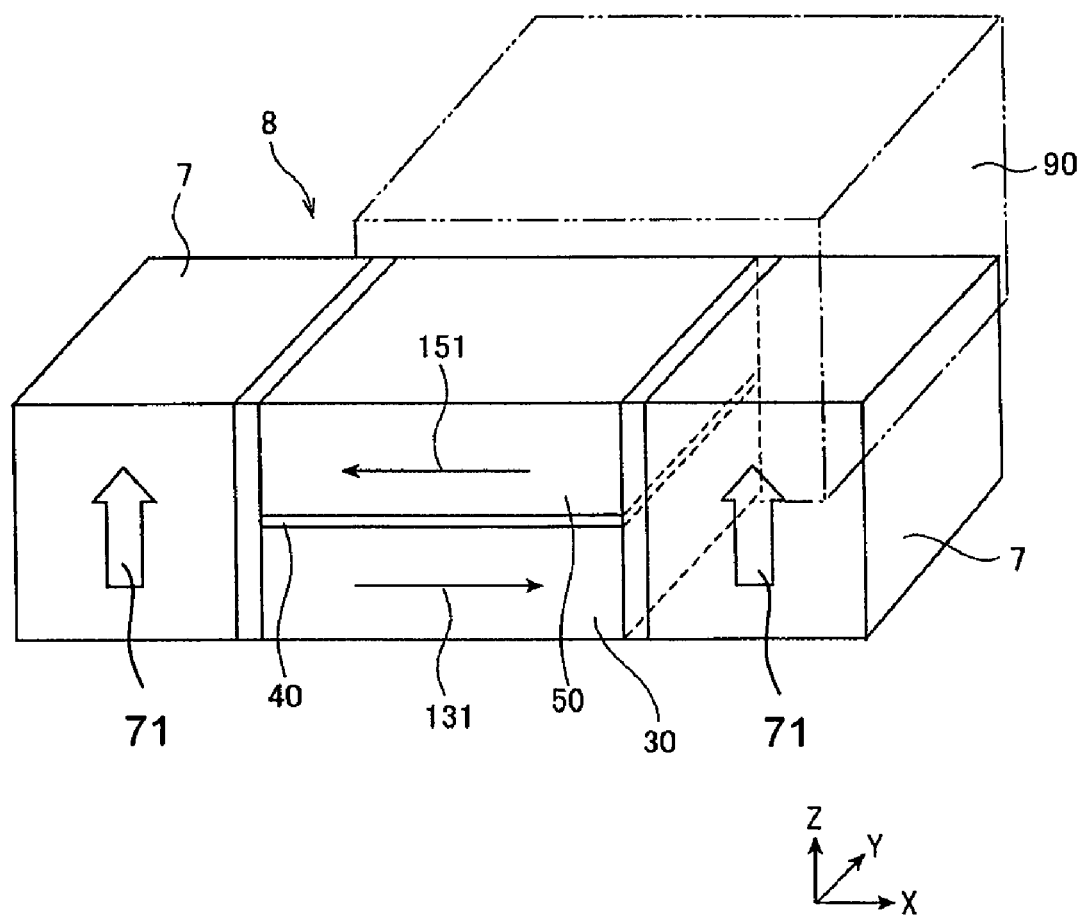
FIG. 1 is a perspective view schematically showing a structure of primary parts of an MR element of the present invention.

As shown in the schematic perspective view in FIG. 1, an MR element according to the present invention has an MR part 8 having a nonmagnetic intermediate layer 40, a first ferromagnetic layer 30 that functions as a free layer and a second ferromagnetic layer 50 that functions as a free layer. The first and second ferromagnetic layers 30 and 50 are laminated to sandwich the nonmagnetic intermediate layer 40. The MR element has a current perpendicular to plane (CPP) structure in which a sense current is applied to the MR part in the laminating direction. The MR part 8 is considered as a so-called a sensor area.

An orthogonalizing bias function part 90 is formed on the rear part of the MR part 8 in order to influence the action of substantially orthogonalizing the magnetization directions of the first ferromagnetic layer 30 and the second ferromagnetic layer 50.

In the present invention, side shield layers 7 configured with perpendicular magnetized layers are disposed at the both sides of the MR part 8 in its width direction as shown in FIG. 1.

The side shield layers 7 have a magnetic shield function that shields an element from external magnetic fields, specifically, a signal magnetic field (a signal magnetic field that is not supposed to read) from an adjacent track. Nonmagnetic layers are provided between both sides of the MR part 8 and the side shield layers 7.

A detailed explanation of each structure is given below.

[First Ferromagnetic Layer 30 and Second Ferromagnetic Layer 50]

As discussed above, the lamination body of the first ferromagnetic layer 30, the nonmagnetic intermediate layer 40, and the second ferromagnetic layer 50 configures the sensor area. The total thickness of the lamination body is approximately 10-20 nm.

Among the above lamination body, the first ferromagnetic layer 30 and the second ferromagnetic layer 50 function as so-called free layers of which magnetization directions of each layer vary depending on an externally applied magnetic field (signal).

A material configured for the first ferromagnetic layer 30 and the second ferromagnetic layer 50 is, for example, NiFe, CoFe, CoFeB, CoFeNi, $CO_2MnSi$, $CO_2MnGe$, or $FeO_x$ (Fe oxides).

These layers can be configured with not only a single layer structure, but also a laminated body with a multiple-layer structure.

Each of layer thicknesses for the first ferromagnetic layer 30 and the second ferromagnetic layer 50 is approximately 0.5-8 nm.

[Nonmagnetic Intermediate Layer 40]

The nonmagnetic intermediate layer 40 is an essential layer to generate the MR effect and is made of, for example, Cu, Au, Ag, Zn, Ga, TiOx, ZnO, InO, SnO, GaN, ITO (indium tin oxide), $Al_2O_3$, or MgO. The nonmagnetic intermediate layer 40 is configured with a lamination layer with a two or more-layer structure.

A layer thickness of the nonmagnetic intermediate layer 40 is approximately 0.5-5 nm.

[Orthogonalizing Bias Function Part 90]

The orthogonalizing bias function part 90 is generally configured with a permanent magnet that can apply a bias magnetic field in approximately the Y axis direction.

As shown in FIG. 1, the orthogonalizing bias function part 90 that is made of a permanent magnet and so on is disposed on the posterior area opposite to an ABS, which corresponds to an opposing medium surface of an element, and the initial state is created using a bias magnetic field generated from the orthogonalizing bias function part 90 in which the magnetization directions of the two magnetic layers (free layers) 30 and 50 are orthogonal each other, and each of the magnetization directions tilts approximately 45 degrees relative to the track width direction (initial state). Specifications (magnet performance, size, disposition location, and so on) of the orthogonalizing bias function part 90 are decided to provide the initial state.

At a time when an element in the initial magnetization state detects a signal magnetic field from a medium, the magnetization directions of the two magnetic layers 30 and 50 change in a scissor-like action like a pair of scissors cuts paper. As a result, a resistance value of the element changes. This performance is explained later in detail.

[Side Shield Layer 7]

As discussed above, the side shield layers 7 is provided to magnetically shield an element from external magnetic fields, specifically, a signal magnetic field (a signal magnetic field that is not supposed to read) from an adjacent track.

In the present invention, the most notable things are that the side shield layer 7 is configured with a perpendicular magnetized layer, and the magnetization direction of the side shield layer 7 is a perpendicular direction that corresponds the thickness direction (the Z axis direction).

Namely, the magnetization direction of the side shield layer 7 is perpendicular to a lamination layer plane (X-Y plane). So long as the magnetization direction is perpendicular to the lamination layer plane, the magnetization direction may be an upper direction or a lower direction. Magnetization of the upper direction (arrows 71) is shown in FIG. 1.

The perpendicular magnetized layer configured for the side shield layer 7 is formed to contain Co and Ni. Alternatively, the perpendicular magnetized layer is formed to contain Co, Ni, and Fe. Ordinarily, the perpendicular magnetized layer is configured with a multiple-layer structure that laminated several layers.

As a detailed example, the perpendicular magnetized layer configured for the side shield layer 7 is formed with the multiple-layer structure in which a $Co_xFe_{100-x}$ layer ($80 \leq x \leq 100$, preferably $90 \leq x \leq 100$) and a $Ni_yFe_{100-y}$ layer ($80 \leq y \leq 100$, preferably $90 \leq y \leq 100$) are alternatively laminated as a lamination layer. When the value of x discussed above is less than 80, there is an inconvenience that an easy magnetization axis of the multiple-layer is not oriented to a perpendicular direction with respect to the lamination layer plane. When the value y discussed above is less than 80, there is an inconvenience that an easy magnetization axis of the multiple-layer is not oriented to a perpendicular direction with respect to the lamination layer plane.

In the structure of the perpendicular magnetized layer configured with the multiple-layer structure, where a layer thickness of the $Co_xFe_{100-x}$ layer is t1, and a layer thickness of the $Ni_yFe_{100-y}$ layer is t2, a thickness ratio of t1 and t2 (t2/t1) is $1.5 \leq (t2/t1) \leq 2.5$, more preferably, $2.0 \leq (t2/t1) \leq 2.5$.

When the ratio (t2/t1) is less than 1.5, there is an inconvenience that an easy magnetization axis of the multiple-layer is not oriented to a perpendicular direction with respect to the lamination layer plane.

On the other hand, when the ratio (t2/t1) is more than 2.5, there is an inconvenience that an easy magnetization axis of the multiple-layer is not oriented to a perpendicular direction with respect to the lamination layer plane as well.

The t1 is approximately 0.2-0.4 nm. The t2 is approximately 0.3-1.0 nm.

A preferable layer thickness of the perpendicular magnetized layer configured for the side shield layer 7 is approximately 10-25 nm.

When a two-layer lamination body of the $Co_xFe_{100-x}$ layer and the $Ni_yFe_{100-y}$ layer is considered as a one pair, a number of pairs for lamination layers configured for the side shield layer 7 is preferably 10-40.

The perpendicular magnetized layer is formed by layer forming methods, such as a sputtering method, an e-beam evaporation method, and so on.

In the present invention, perpendicular in a magnetization direction means that when an M-H loop is measured by using an in-plane direction (a direction along the lamination layer plane) and a perpendicular to plane direction (a direction perpendicular to the lamination layer plane), the perpendicular to plane direction is an easy magnetization axis. Here, M represents magnetization, and H represents an application magnetic field.

A determination of whether or not the magnetization direction of the side shield layer 7 is perpendicular to plane is confirmed through a method for measuring the M-H loop by using the in-plane direction (the same direction to a lamination layer plane) and the perpendicular to plane direction (the perpendicular direction to a lamination layer plane).

The reasons why the magnetization direction of the side shield layer 7 (perpendicular magnetized layer) is decided as the perpendicular direction are explained below.

When the side shield layer is simply formed with a soft magnetic layer, such as NiFe, a magnetization direction in a state in which an externally applied magnetic field is zero is not identified. But to mention one, the magnetization direction tends to be oriented in a cross direction (width direction) with an influence of shape anisotropy and so on. Because the side shield layer itself is magnetized in the cross direction, a magnetic field from the cross direction, i.e., from the side shield layer, is applied to an element. When the magnetic field in the cross direction is applied to the so-called DFL element structure, an initial state of orthogonalized two free layers is broken. This is shown in FIG. 17.

Figure 15:
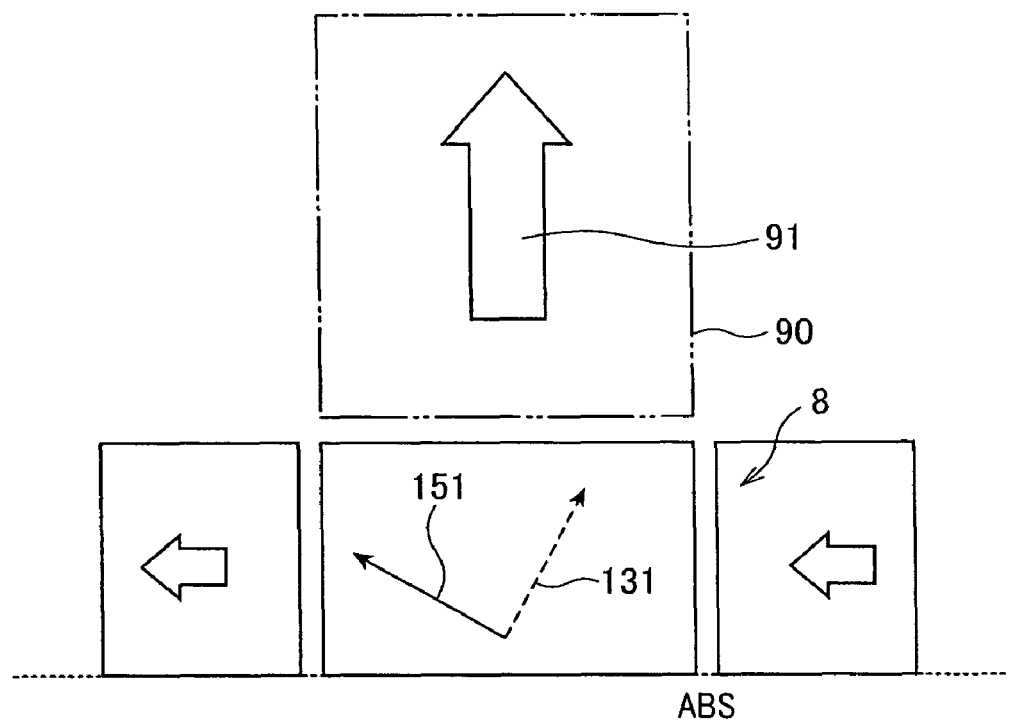
FIG. 15 is a diagram schematically showing a state (unfavorable state) in which an initial state of two free layers is broken when a magnetic field in a cross direction is applied to an element.

In FIG. 15, magnetization directions in the initial state are not in a correct direction. Namely, the magnetization directions of the two free layers are not in the proper initial state tilting about 45 degrees relative to the track width direction, respectively. In this case, a behavior balance of moving of the magnetization directions is broken, and there is a possibility that the DFL element cannot operate properly.

In contrast, the side shield layer 7 according to the present invention is the perpendicular magnetized layer. Because the magnetization direction is in the orthogonal direction with respect to the layer surface, the magnetic field in the cross direction is not applied to an element. Therefore, the initial state of the orthogonalized two free layers is always stable and same state, and a normal detection of the external magnetic field is performed.

[Explanation of Detection Operation for External Magnetic Field by MR Element]

Next, a detection operation for an external magnetic field by a DFL-type MR element is explained with reference to FIGS. 1-5.

Figure 2:
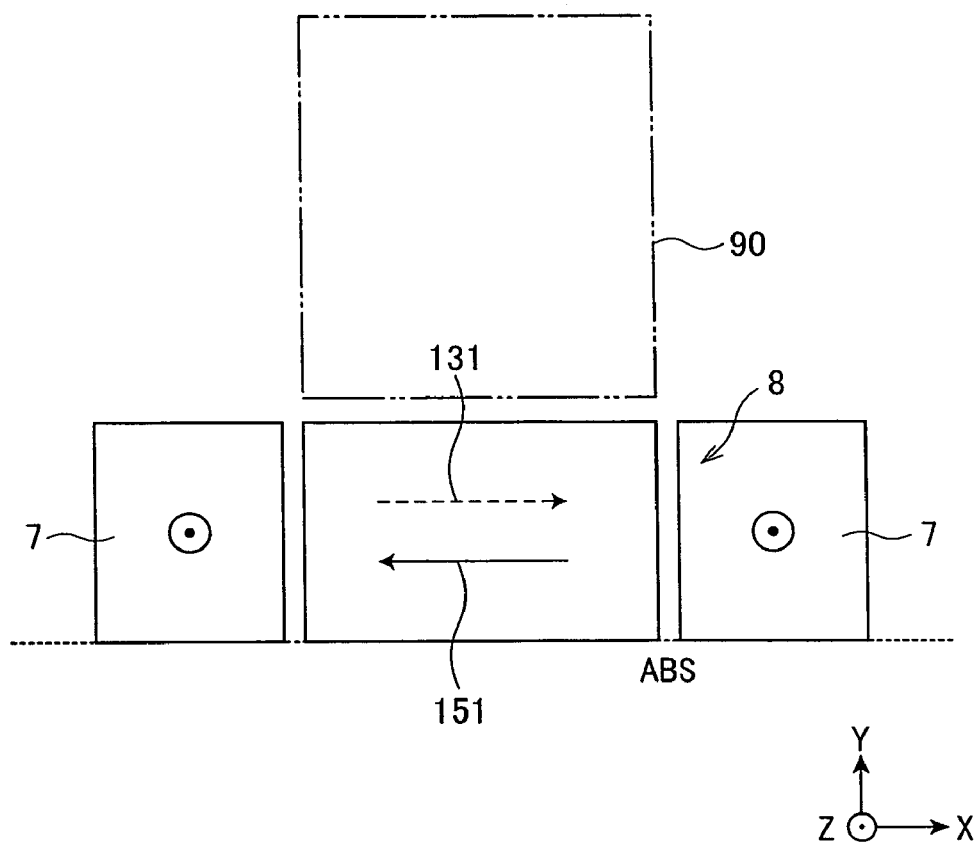
FIG. 2 is a top plan view taken by the X-Y plane as seen from above in FIG. 1.

The MR element, as shown in FIGS. 1 and 2, the magnetization direction 131 of the first ferromagnetic layer 30 (free layer 30) and the magnetization direction 151 of the second ferromagnetic layer 50 (free layer 50) are opposite to each other and antiparallel to each other in the track width direction (i.e., the X axis direction in the drawing) in a state that is before the orthogonalizing bias function part 90 starts functioning (for example, a state before a magnetization operation in the Y axis direction is performed to the orthogonalizing bias function part 90). There are several methods for forming the antiparallel state in which the magnetization directions 131 and 151 become opposite to each other. These specific methods will be described below.

Figure 3:
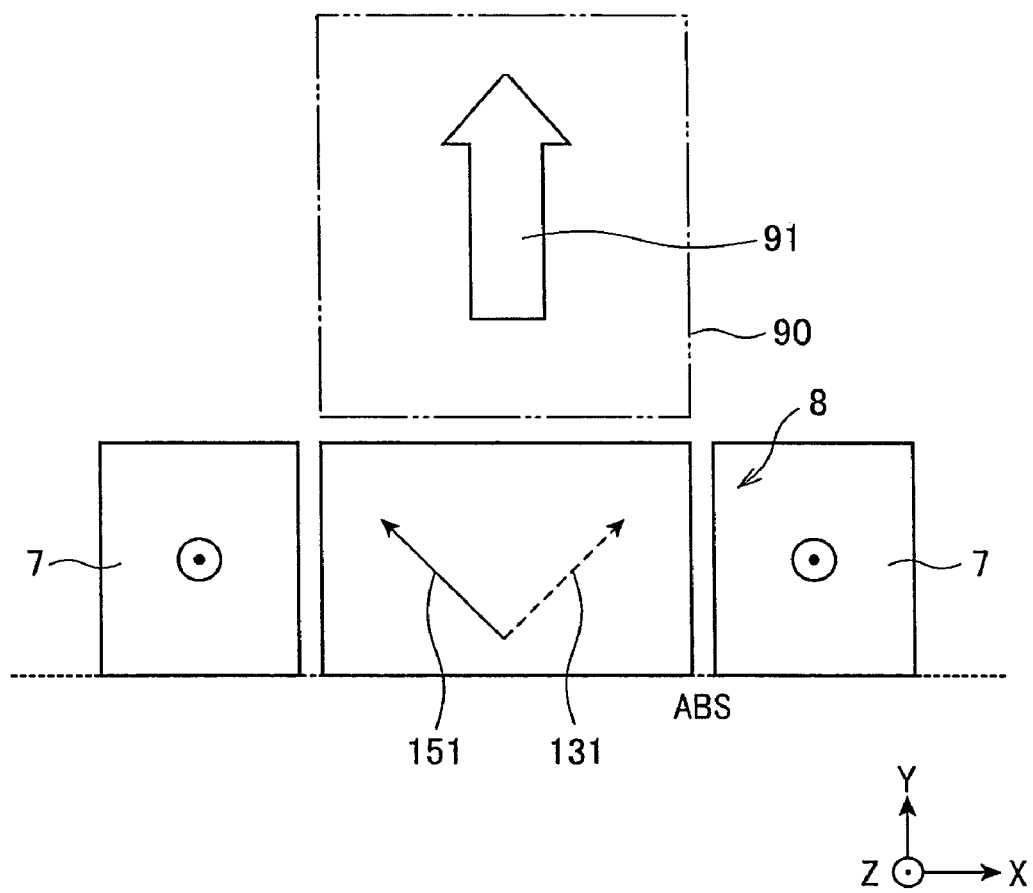
FIG. 3 is a top plan view taken by the X-Y plane as seen from above in FIG. 1, which is a model diagram showing the state change of magnetization in response to an external magnetic field that shows an MR effect change of an MR element according to the present invention.

As shown in FIG. 3, the orthogonalizing bias function part 90 placed on the rear side of the first ferromagnetic layer 30 and the second ferromagnetic layer 50 (i.e., posterior area in the Y axis direction) is magnetized (e.g., polarized) from the ABS that is the opposing medium surface toward the posterior area side in the Y axis direction. This is referred to as "ABS in magnetization." The magnetization direction 91 is perpendicular to the ABS toward the posterior side. By this magnetization (e.g., polarization), the magnetization directions 131 and 151 of the first ferromagnetic layer 30 and the second ferromagnetic layer 50, respectively, that have been antiparallel to each other are tilted about 45 degrees relative to the track width direction (i.e., the X axis direction in the drawing) to make the initial state. Accordingly, the magnetization directions 131 and 151 are in a substantially orthogonal relationship to each other.

As used herein, the "substantially orthogonal relationship" refers to the range of 90 degrees+/−20 degrees. Ideally, 90 degrees is preferable.

Figure 4:
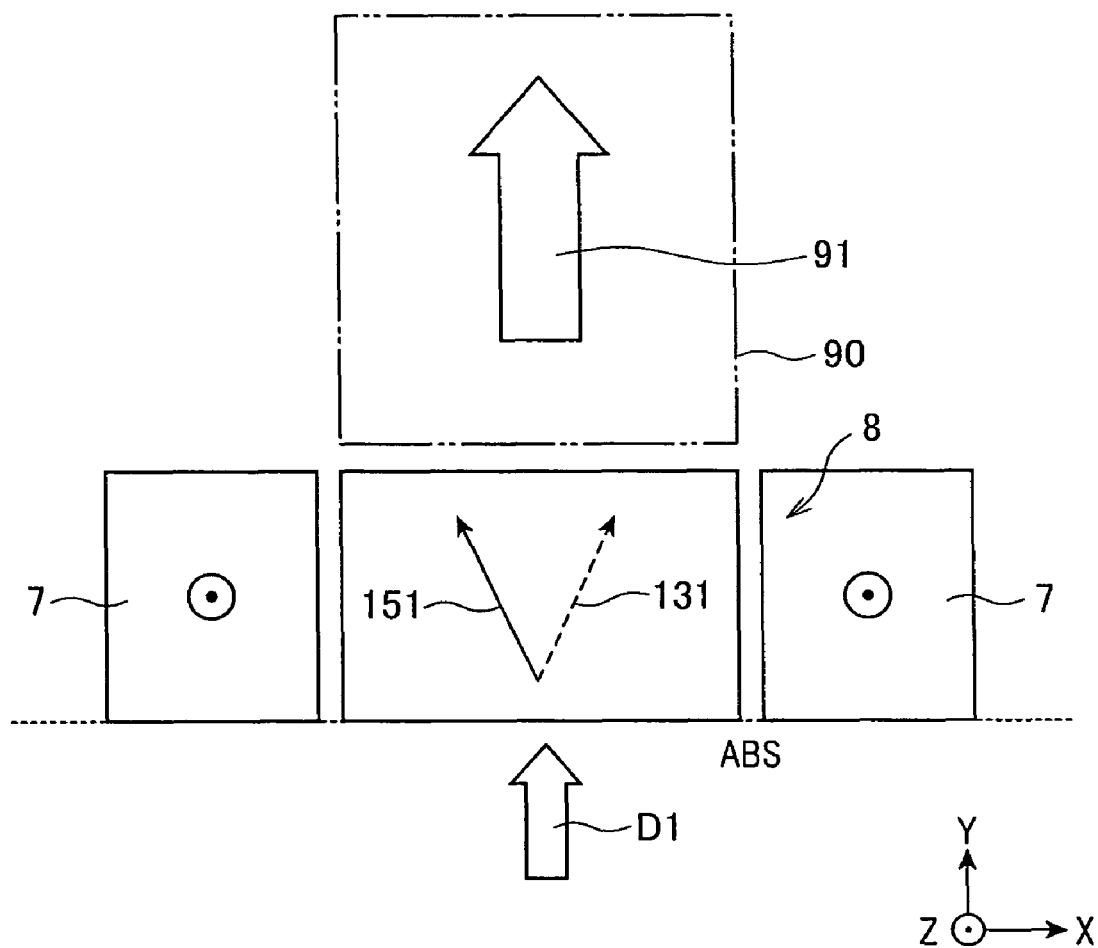
FIG. 4 is a top plan view taken by the X-Y plane as seen from above in FIG. 1, which is a model diagram showing the state change of magnetization in response to an external magnetic field that shows an MR effect change of an MR element according to the present invention.

The magnetization directions of the two ferromagnetic layers 30 and 50 in the initial magnetization state changes in a scissor-like action like a pair of scissors cuts paper when these layers detect a signal magnetic field applied from a medium, resulting in a change in resistance values of an element. In other words, as shown in FIG. 4, the magnetization direction 131 of the first ferromagnetic layer 30 and the magnetization direction 151 of the second ferromagnetic layer 50 tend to move in the same direction when these layers detect an external magnetic field D1 applied in the direction toward the element from the ABS. As a result, the resistance of the element decreases.

Figure 5:
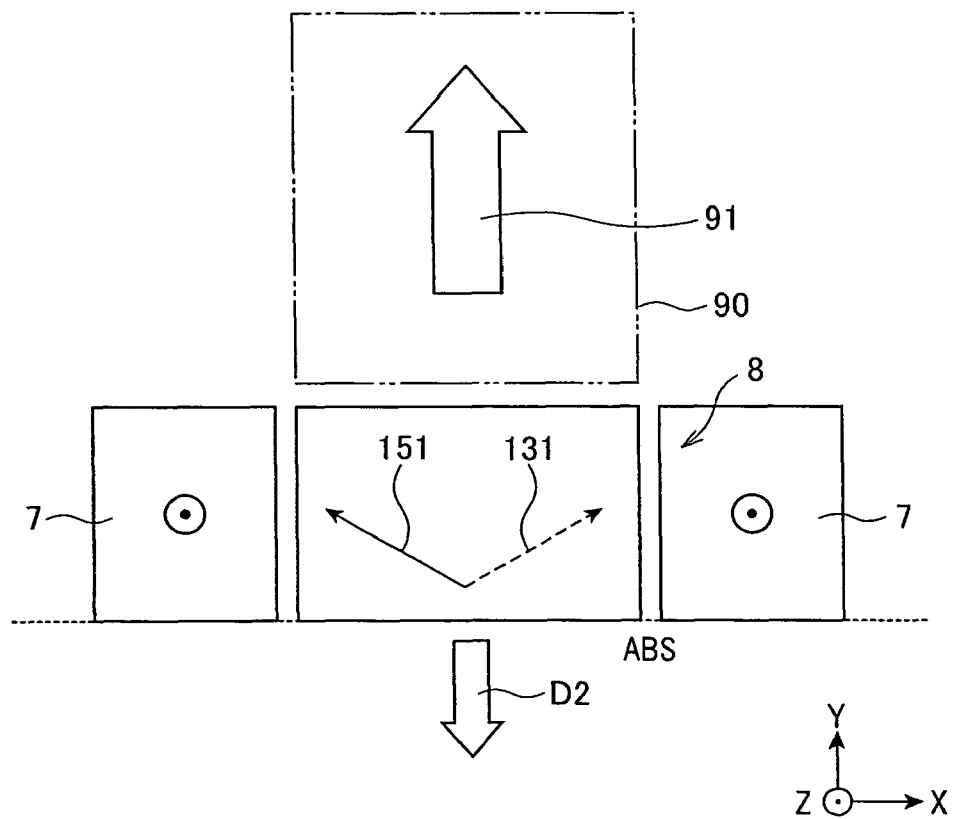
FIG. 5 is a top plan view taken by the X-Y plane as seen from above in FIG. 1, which is a model diagram showing the state change of magnetization in response to an external magnetic field that shows an MR effect change of an MR element according to the present invention.

On the other hand, as shown in FIG. 5, the magnetization direction 131 of the first ferromagnetic layer 30 and the magnetization direction 151 of the second ferromagnetic layer 50 tend to move in the opposite direction each other when these layers detect an external magnetic field D2 applied in the direction away from the ABS. As a result, the resistance of the element increases.

Thus, an external magnetic field can be detected by measuring a series of resistance changes in response to the external magnetic field.

The appropriate orthogonalization of the initial magnetization directions 131 and 151 as shown in FIG. 3 can be achieved by adjusting the magnetization intensity of the orthogonalizing bias function part 90, adjusting the changeability of the magnetization directions of the ferromagnetic layers 30 and 50 that function as free layers, or the like.

The magnetization direction of the orthogonalizing bias function part 90 may be the "ABS out magnetization," which is an inversion of the magnetization direction by 180 degrees, instead of the above-mentioned "ABS in magnetization." In other words, the orthogonalizing bias function part 90 may be magnetized in the Y axis direction from the posterior area side toward ABS that is opposing medium surface.

[Methods for Forming Antiparallel State in which Magnetization Directions 131 and 151 of Magnetic Layers 30 and 50, Respectively, are Opposite Each Other]

The following explains some methods for making the magnetization directions of two free layers 30 and 50 antiparallel to each other in the track width direction before the orthogonalizing bias function part 90 starts functioning (i.e., before a bias is applied) as shown in FIG. 1 and FIG. 2.

First Model

In the first model, the first ferromagnetic layer 30 and the second ferromagnetic layer 50 are exchange-coupled through the nonmagnetic intermediate layer 40 in such a way that the magnetization direction of the first ferromagnetic layer 30 and the second ferromagnetic layer 50 are antiparallel to each other before a bias magnetic field is applied from the orthogonalizing bias function part 90.

Figure 6:
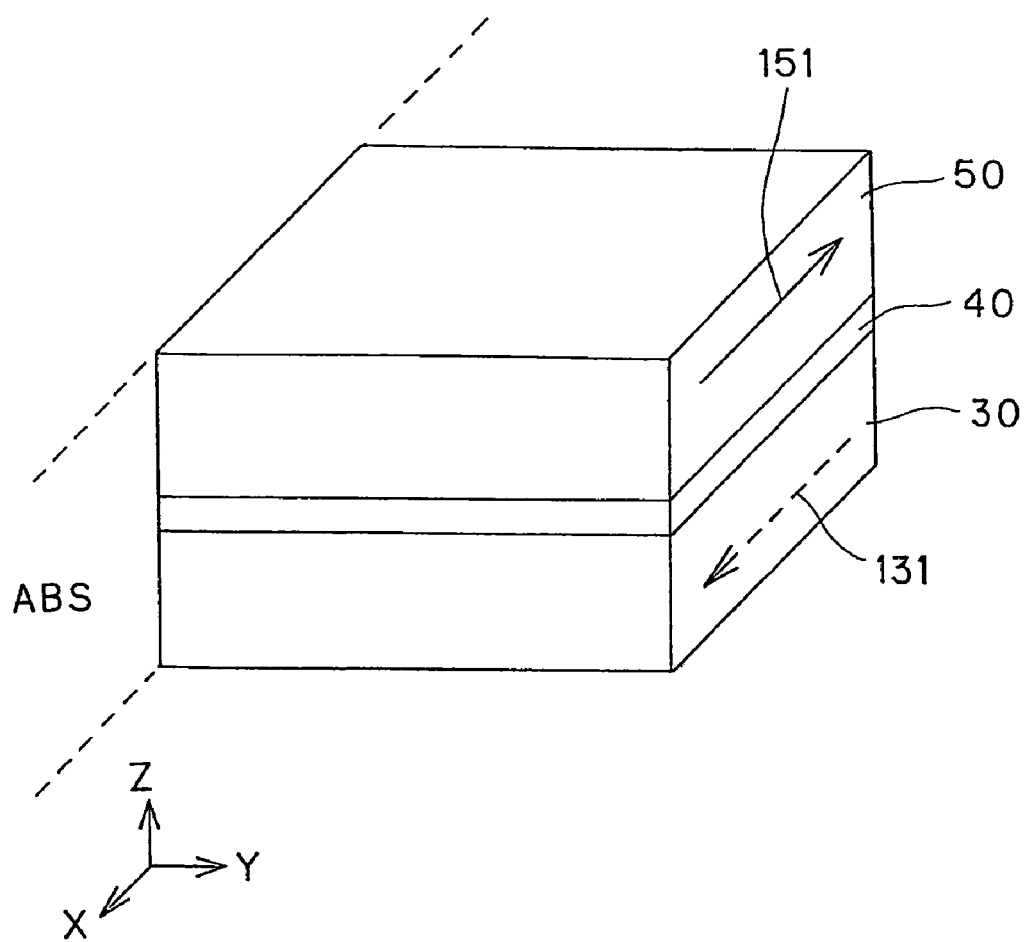
FIG. 6 is a perspective view showing the state in which a first ferromagnetic layer and a second ferromagnetic layer are exchange-coupled via a nonmagnetic intermediate layer in such a way that their magnetization directions are antiparallel to each other.

In this state, as shown in FIG. 6, for example, the magnetization direction 131 of the first ferromagnetic layer 30 and the magnetization direction 151 of the second ferromagnetic layer 50 are exchange-coupled through the nonmagnetic intermediate layer 40 to become antiparallel to each other.

In the first model, a material used for the first ferromagnetic layer 30 and the second ferromagnetic layer 50 includes NiFe, CoFe, CoFeB, CoFeNi, $CO_2MnSi$, $CO_2MnGe$, $FeO_x$ (Fe oxides) and $CoO_x$ (Co oxides), as discussed above. A layer thickness of each layer is approximately 0.5-0.8 nm.

These layers function as free layers whose magnetization directions change under the influence of a magnetic field applied externally.

In the first model, a material used for the nonmagnetic intermediate layer 40 includes Ru, Ir, Rh, Cr, Cu, Zn, Ga, ZnO, InO, SuO, GaN, ITO (indium tin oxide), $Al_2O_3$, and MgO. The layer thickness is approximately 0.5-5 nm. In order to antiferromagnetically couple the magnetization of the two ferromagnetic layers 30 and 50 (free layers), there are some limitations on the material used for the nonmagnetic intermediate layer 40 and the setup of its film thickness.

Second Model

Figure 7:
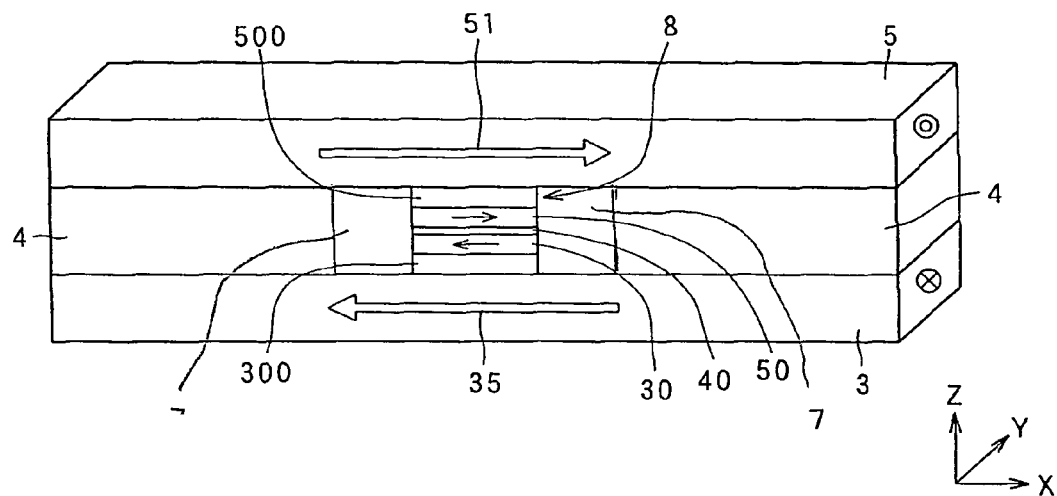
FIG. 7 is a perspective view as seen from an air bearing surface (ABS) of an MR element.

As shown in FIG. 7, an MR element has an MR part 8, and a first shield layer 3 (also referred to as a lower shield layer 3) and a second shield layer 5 (also referred to as an upper shield layer 5) that vertically sandwich the MR part 8. Also, the MR element has a current perpendicular to plane (CPP) structure in which a sense current is applied in the lamination direction of the MR part 8.

Each of the magnetization directions of the first shield layer 3 and the second shield layer 5 is controlled by a magnetization direction control means. In the model as shown in FIG. 7, the magnetization 35 of the first shield layer 3 is pinned in the minus width direction (−X axis direction) from right to left in the drawing. On the other hand, the magnetization 51 of the second shield layer 5 is pinned in the plus width direction (+X axis direction) from left to right in the drawing. Each of the first shield layer 3 and the second shield layer 5 is preferably controlled by the magnetization direction control means to have a single magnetic domain.

The MR part 8 has a nonmagnetic intermediate layer 40, and a first ferromagnetic layer 30 and a second ferromagnetic layer 50 that are laminated to sandwich the nonmagnetic intermediate layer 40.

A lamination body of the first ferromagnetic layer 30, the nonmagnetic intermediate layer 40 and the second ferromagnetic layer 50 structures a sensor area. The total layer thickness of the lamination body is approximately 10-20 nm.

Each of the first ferromagnetic layer 30 and the second ferromagnetic layer 50 functions as a so-called free layer in which the magnetization direction varies depending on an externally applied magnetic field.

The first ferromagnetic layer 30 and the second ferromagnetic layer 50 are influenced by some action to form the antiparallel magnetization state in which their magnetization directions are opposite under the influence of the magnetic action of the first shield layer 3 and the second shield layer 5, respectively. Here, the expression "influenced by some action to form the antiparallel magnetization state" is used because, in a practically used MR element, the magnetization directions of the first ferromagnetic layer 30 and the second ferromagnetic layer 50 are substantially orthogonalized by a bias magnetic field applied from the orthogonalizing bias function part 90.

In order to realize the above-mentioned antiparallel magnetization state, a first exchange-coupling function gap layer 300 is placed between the first shield layer 3 and the first ferromagnetic layer 30, and a second exchange-coupling function gap layer 500 is placed between the second shield layer 5 and the second ferromagnetic layer 50. In other words, the first ferromagnetic layer 30 is magnetically coupled indirectly with the first shield layer 3 whose magnetization direction is controlled through the first exchange-coupling function gap layer 300. The second ferromagnetic layer 50 is magnetically coupled indirectly with the second shield layer 5 whose magnetization direction is controlled through the second exchange-coupling function gap layer 500.

Figure 8:
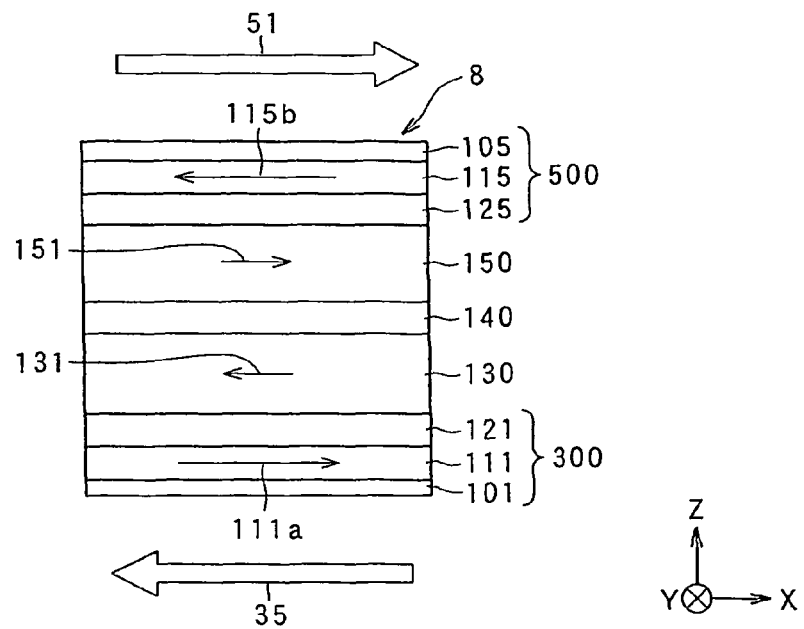
FIG. 8 is a schematic view showing an MR part containing a sensor area of an MR element on an enlarged scale.

A description of one embodiment of the structure of the first exchange-coupling function gap layer 300 is given below with reference to FIG. 8. However, the present invention is not limited to the below-mentioned structure.

The first exchange-coupling function gap layer 300 is sequentially configured with, from the first shield layer 3 side, an exchange-coupling transmitting layer 101, a gap adjustment layer 111 and an exchange-coupling adjustment layer 121. The gap adjustment layer 111 is a so-called ferromagnetic layer that is structured of a ferromagnetic body.

The exchange-coupling transmitting layer 101 is configured with at least one material selected from the group of Ru, Rh, Ir, Cr, Cu, Ag, Au, Pt and Pd, and is configured to function to adjust the magnetic coupling strength of the magnetization 35 of the first shield layer 3 and the magnetization 111a of the gap adjustment layer 111 by setting the properties and thickness of each material selected. Moreover, the setting of properties and thickness of each material selected allows determining the direction of the magnetization 111a of the gap adjustment layer 111 that is magnetically coupled with the magnetization 35 of the first shield layer 3. In other words, it is determined to be either antiferromagnetic coupling, where layers are magnetically coupled having magnetization in the direction opposite to each other, or ferromagnetic coupling, where layers are magnetically coupled having magnetization in the same direction.

The exchange-coupling adjustment layer 121 is configured with at least one material selected from the group of Ru, Rh, Ir, Cr, Cu, Ag, Au, Pt and Pd and allows adjusting the magnetic coupling strength of the magnetization 111a of the gap adjustment layer 111 and the magnetization direction 131 of the first ferromagnetic layer 130 by setting the properties and thickness of each material selected. Moreover, the setting of properties and thickness of each material selected allows determining the direction of the magnetization direction 131 of the first ferromagnetic layer 130 that is magnetically coupled with the magnetization 111a of the gap adjustment layer 111. In other words, it is determined to be either antiferromagnetic coupling or ferromagnetic coupling.

The layer thickness of the first exchange-coupling function gap layer 300 is set to approximately 1.5-6.0 nm.

Similarly, a description of one embodiment of the structure of the second exchange-coupling function gap layer 500 is given below with reference to FIG. 8. However, the present invention is not limited to the below-mentioned structure.

The second exchange-coupling function gap layer 500 is configured with sequentially, from the second shield layer 5 side, an exchange-coupling transmitting layer 105, a gap adjustment layer 115 and an exchange-coupling adjustment layer 125. The gap adjustment layer 115 is a so-called ferromagnetic layer structured of a ferromagnetic body.

The exchange-coupling transmitting layer 105 is configured with at least one material selected from the group of Ru, Rh, Ir, Cr, Cu, Ag, Au, Pt and Pd and allows adjusting the magnetic coupling strength of the magnetization 51 of the second shield layer 5 and the magnetization 115b of the gap adjustment layer 115 by setting the properties and thickness of each material selected. Moreover, the setting of properties and thickness of each material selected allows determining the direction of the magnetization 115b of the gap adjustment layer 115 that is magnetically coupled with the magnetization 51 of the second shield layer 5. In other words, it is determined to be either antiferromagnetic coupling (where layers are magnetically coupled having magnetization in the direction opposite to each other) or ferromagnetic coupling (where layers are magnetically coupled having magnetization in the same direction).

The exchange-coupling adjustment layer 125 is configured with at least one material selected from the group of Ru, Rh, Ir, Cr, Cu, Ag, Au, Pt and Pd and allows adjusting the magnetic coupling strength of the magnetization 115b of the gap adjustment layer 115 and the magnetization direction 151 of the second ferromagnetic layer 150 by setting the properties and thickness of each material selected. Moreover, the setting of properties and thickness of each material selected allows determining the direction of the magnetization direction 151 of the second ferromagnetic layer 150 that is magnetically coupled with the magnetization 115b of the gap adjustment layer 115. In other words, it is determined to be either antiferromagnetic coupling or ferromagnetic coupling.

The layer thickness of the second exchange-coupling function gap layer 500 is set to approximately 1.5-6.0 nm.

The reference numeral 4 in the drawing shows insulating layers.

Third Model

Figure 9:
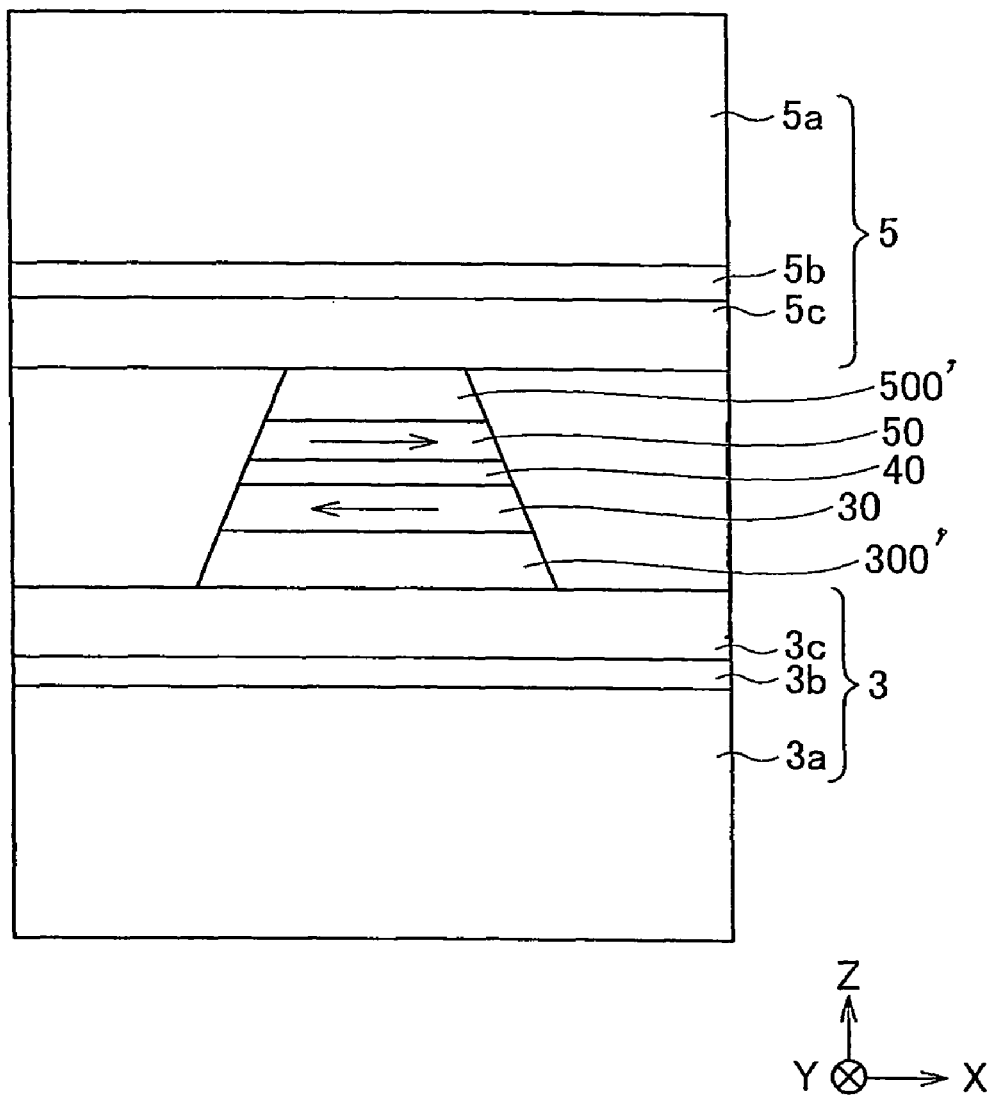
FIG. 9 is a diagram as seen from an ABS side explaining an element structured in a manner of using magnetization of part of a shield layer pin-controlled through an antiferromagnetic layer in order to make magnetization directions of a first ferromagnetic layer and a second ferromagnetic layer, both of which function as a free layer, antiparallel to each other.

In order to make the magnetization directions of the first ferromagnetic layer 30 and the second ferromagnetic layer 50, both of which function as free layers, antiparallel to each other, the third model uses the magnetization of part of a shield layer that is pin-controlled by an antiferromagnetic layer as shown in FIG. 9. The third model is preferred because it is specifically easy to control the movement of the magnetization direction of the free layers.

In other words, as shown in FIG. 9, a first shield layer 3 has a lamination structure of sequentially from the lower side, for example, a lower main shield layer (3a) made of NiFe having a layer thickness of 1000-2000 nm/an antiferromagnetic layer (3b) made of IrMn having a layer thickness of 7 nm/a lower exchange-coupling shield layer 3c that exchange-couples a pair of the combined lamination body of a CoFe layer and a NiFe layer through a Ru layer.

A second shield layer 5 has a lamination structure of sequentially from the upper side, for example, an upper main shield layer (5a) made of NiFe having a layer thickness of 1000-2000 nm/an antiferromagnetic layer (5b) made of IrMn having a layer thickness of 7 nm/an upper exchange-coupling shield layer 5c that exchange-couples a pair of the combined lamination body of a CoFe layer and a NiFe layer through a Ru layer.

The first shield layer 3 and the second shield layer 5 having such structures are configured to sandwich the MR part 8 through a first antiferromagnetic coupling intermediate layer 300' and a second antiferromagnetic coupling intermediate layer 500', respectively, in order to make the magnetization directions of the first ferromagnetic layer 30 and the second ferromagnetic layer 50, both of which function as free layers, antiparallel to each other.

The above-mentioned MR element is generally used as a sensor for reading the magnetic information of a thin film magnetic head after the wafer processing. A description of the overall structure of a thin film magnetic head containing an MR element is briefly explained below.

[Explanation of Overall Structure of Thin Film Magnetic Head]

Figure 10:
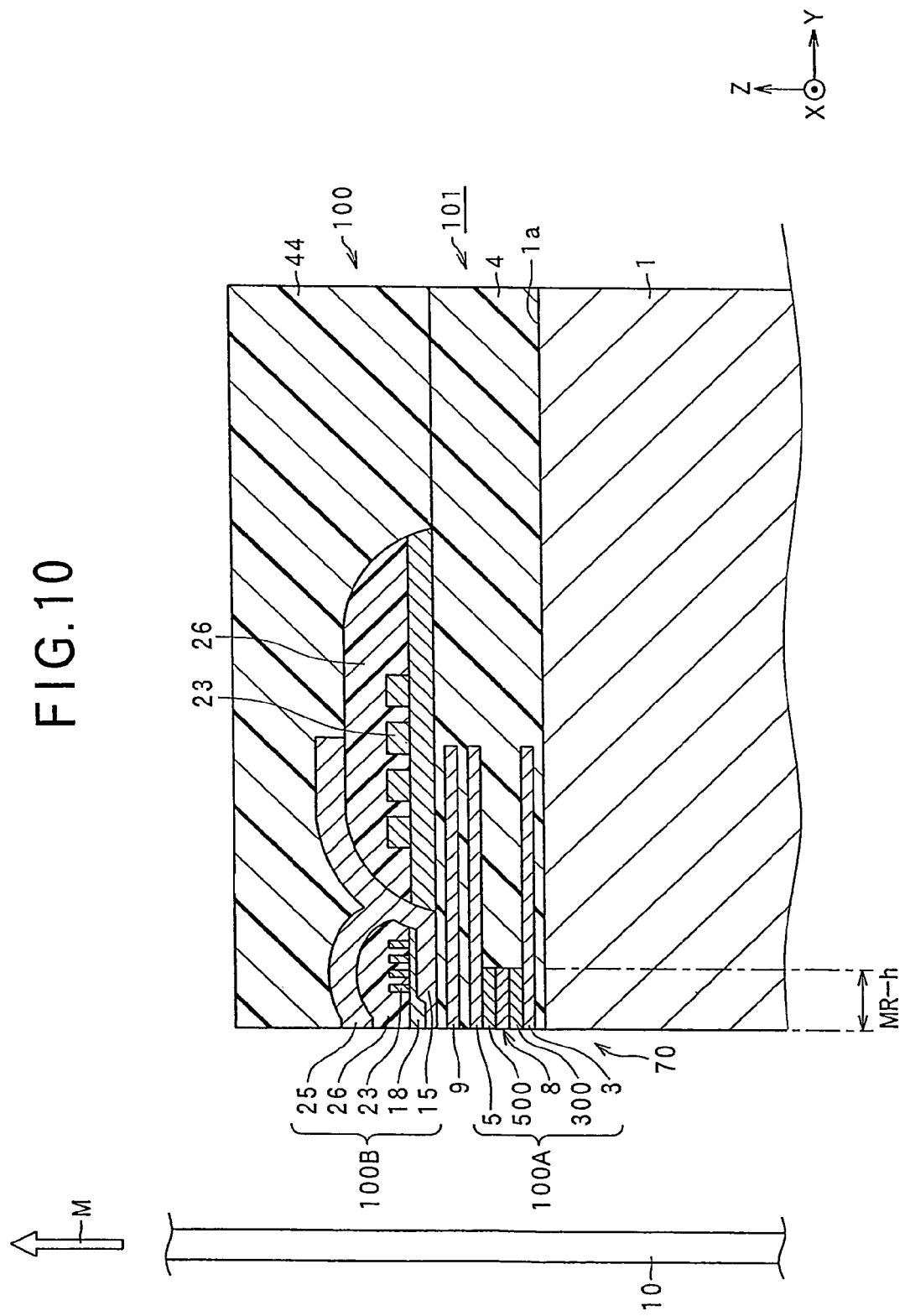
FIG. 10 is a sectional view of a thin film magnetic head that is parallel to an ABS.

FIG. 10 shows a sectional view (i.e., a cross section taken through the Y-Z plane) of a thin film magnetic head in parallel with the so-called air bearing surface (ABS).

A thin film magnetic head 100 as shown in FIG. 10 is mounted on a magnetic recording device such as a hard disk drive in order to magnetically process a recording medium 10 such as a hard disk that moves in a medium traveling direction M.

The thin film magnetic head 100 as exemplified in the drawing is a so-called complex type head that is executable for both recording processing and reproducing processing as magnetic processing. As shown in FIG. 10, it has a structure of a magnetic head part 101 formed on a slider substrate 1 structured of ceramic material such as ALTIC ($Al_2O_3$.TiC).

A magnetic head part 101 has a lamination structure of a reproducing head part 100A for reproducing magnetic information recorded using the MR effect and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1a of the slider substrate 1. The layers 3 and 5 form a part of the ABS 70.

An MR part 8 is sandwiched between the first shield layer 3 and the second shield layer 5 and forms part of the ABS 70. A height perpendicular to the ABS 70 (i.e., in the Y axis direction) is an MR height (MR-h).

The first shield layer 3 and the second shield layer 5 are formed by a pattern plating method including a frame plating method, for example. Although it is not clearly shown in the drawing, the first shield layer 3 and the second shield layer 5 need to be configured in such a way as to demonstrate the above-mentioned effect of the present invention.

The MR part 8 is a lamination layer substantially parallel to the side surface 1a of the slider substrate 1, and forms a part of the ABS 70.

The MR part 8 is, for example, a lamination layer with a current perpendicular to plane (CPP) structure in which a sense current flows in the direction perpendicular to the lamination surface and is the structure discussed above.

Moreover, as shown in FIG. 10, an interelement shield layer 9 made of the same material as that of the second shield layer 5 is formed between the second shield layer 5 and the recording head part 100B.

The interelement shield layer 9 shields the MR element part 8 from a magnetic field generated by the recording head part 100B, thereby blocking exogenous noise at the time of reproduction. A bucking coil part may also be formed between the interelement shield layer 9 and the recording head part 100B. The bucking coil part generates magnetic flux that overrides a magnetic flux loop that is generated by the recording head part 100B and that passes through the upper and lower electrode layers of the MR element part 8 and, therefore, suppresses unnecessary writing to a magnetic disk or wide area adjacent tracks erasing (WATE) phenomena that are erasing operations.

Insulating films 4 and 44 made of alumina and/or other materials are formed as follows:
  i) in a gap between the first shield layer 3 and the second shield layer 5 on the side opposite to the ABS 70 of the MR element part 8;
  ii) in rear (posterior) regions of the first and second shield layers 3 and 5 and the interelement shield layer 9, the rear regions being opposite to the ABS 70;
  iii) in a gap between the first shield layer 3 and the slider substrate 1; and
  iv) in a gap between the interelement shield layer 9 and the recording head part 100B.

The recording head part 100B is preferably structured for perpendicular magnetic recording and, as shown in FIG. 10, has a main magnetic pole layer 15, a gap layer 18, a coil insulating layer 26, a coil layer 23, and an auxiliary magnetic pole layer 25.

The main magnetic pole layer 15 is structured to be a leading magnetic path for leading and focusing magnetic flux initiated by the coil layer 23 to the recording layer of a magnetic recording medium 10. It is preferred that the end part of the main magnetic pole layer 15 on the side of the ABS 70 should be smaller in thickness compared with other portions in the track width direction (i.e., the direction along the X-axis in FIG. 10) and in the laminating direction (i.e., the direction along the Z-axis in FIG. 10). As a result, it is possible to generate a magnetic field for minute and strong writing corresponding to high recording density.

A trailing shield part that has a wider layer cross section than the other portions of the auxiliary magnetic layer 25 is formed on the end part of the auxiliary magnetic pole layer 25 magnetically coupled with the main magnetic pole layer 15 on the side of the ABS 70. As shown in FIG. 10, the auxiliary magnetic pole layer 25 is opposed to the end part of the main magnetic pole layer 15 on the side of the ABS 70 via the gap layer 18 made of insulating material such as alumina and the coil insulating layer 26.

The provision of the auxiliary magnetic pole layer 25 enables formation of a steep magnetic field gradient between the auxiliary magnetic pole layer 25 and the main magnetic pole layer 15 in the vicinity of the ABS 70. As a result, jitter is reduced in a signal output, thereby making the error rate smaller at the time of reproducing.

The auxiliary magnetic pole layer 25 is formed, for example, to about 0.5-5 μm in thickness by a frame plating method, a sputtering method or the like. The material may be an alloy made of two or three elements selected from the group consisting of Ni, Fe and Co, for example, or an alloy made of these elements, as main components, along with predetermined chemical elements.

The gap layer 18 is formed to separate the coil layer 23 from the main magnetic pole layer 15. The gap layer 18 may be formed by a sputtering method, a CVD method or the like, for example, have a thickness of about 0.01-0.5 μm and be structured of $Al_2O_3$, diamond-like carbon (DLC) or the like.

[Explanation of Head Gimbal Assembly and Hard Disk Device]

Next, a head gimbal assembly on which the above mentioned thin film head is mounted and one embodiment of a hard disk device are described below.

Figure 11:
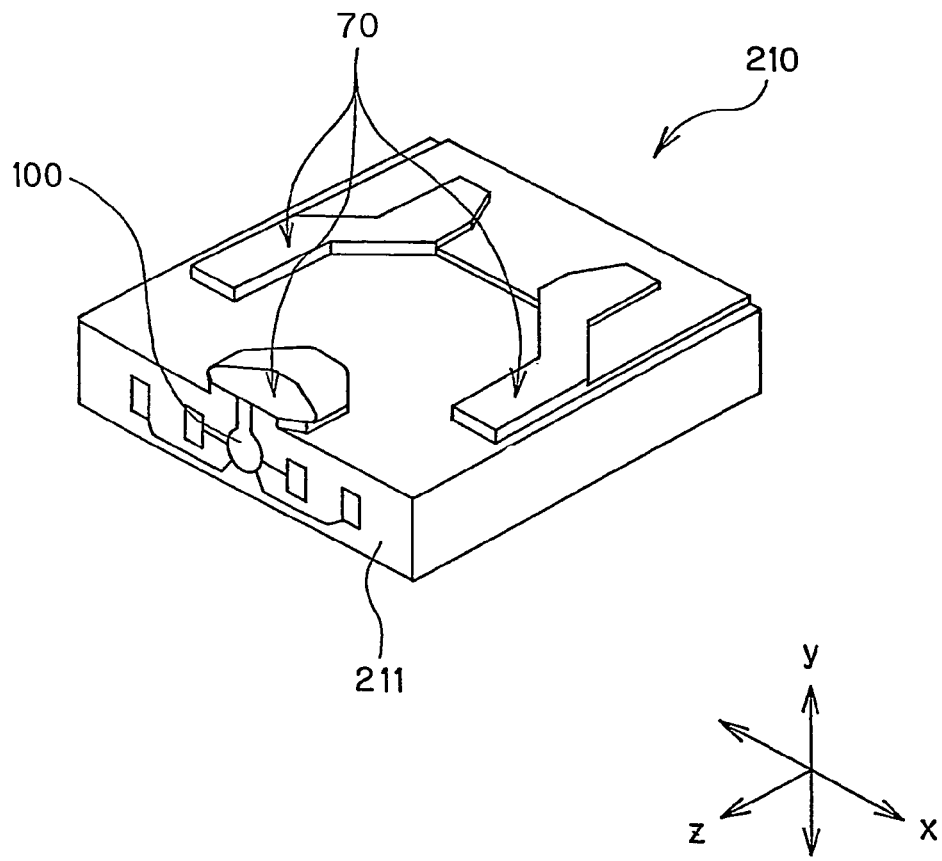
FIG. 11 is a perspective view of a slider that is a part of a head gimbal assembly according to one embodiment of the present invention.

First, a description of a slider 210 equipped with the head gimbal assembly is illustrated in FIG. 11. In the hard disk device, the slider 210 is opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is opposed to a hard disk. The ABS 70 is formed on the surface.

When a hard disk is rotated in the Z direction in FIG. 11, an airflow passing between the hard disk and the slider 210 creates lifting power downwardly in the Y direction in FIG. 11. The slider 210 floats from the surface of the hard disk by this lifting power. The X direction in FIG. 11 is the track traversing direction of the hard disk.

In the vicinity of the end part of the slider 210 on the air exit side (i.e., the end part on the lower left in FIG. 11), the thin film magnetic head according to the present embodiment is formed.

Figure 12:
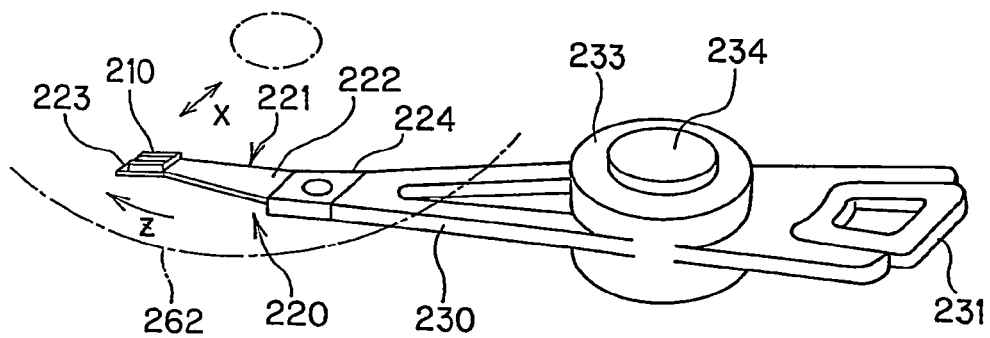
FIG. 12 is a perspective view of a head arm assembly that contains a head gimbal assembly according to one embodiment of the present invention.

Next, a description of the head gimbal assembly 220 according to the present embodiment is described by referring to FIG. 12. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210a proper degree of freedom, and a base plate 224 provided on the other end part of the load beam 222.

The base plate 224 is mounted on an arm 230 of an actuator for moving the slider 210 in the track traversing direction X of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is referred to as a head stack assembly.

FIG. 12 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

Figure 13:
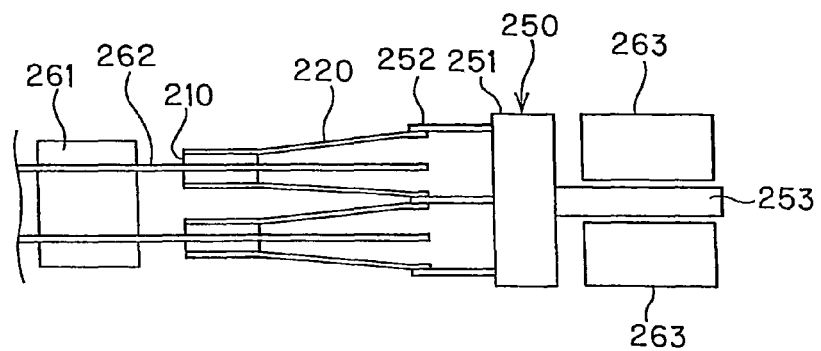
FIG. 13 is an illustration for explaining primary parts of a magnetic disk device according to one embodiment of the present invention.
Figure 14:
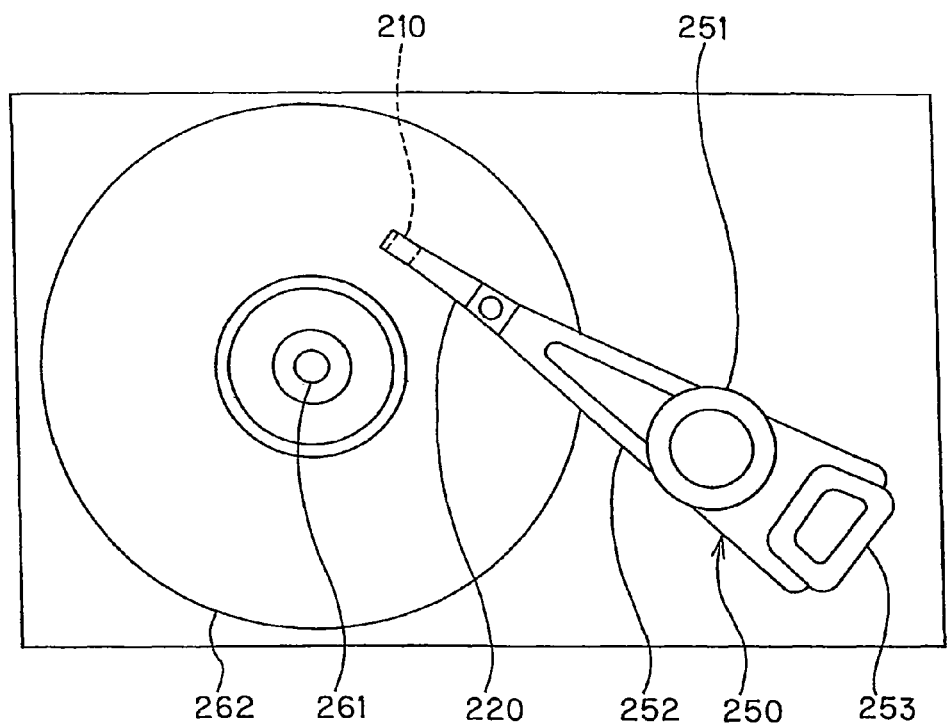
FIG. 14 is a top plan view of a magnetic disk device according to one embodiment of the present invention.

A description of one example of the head stack assembly and the hard disk device according to the present embodiment is described by referring to FIGS. 13 and 14.

FIG. 12 is an illustration for explaining primary parts of a hard disk device. FIG. 14 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider 210 relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

In the embodiment, it is explained that a thin film magnetic head has a structure of a reproducing head part formed on the base substrate side and a perpendicular recording head part layered thereon. However, the layering order may be reversed. Moreover, the configuration may be such that only a reproducing part is provided in the case of a reproduction-only thin film head.

SPECIFIC EXPERIMENTAL EMBODIMENT

A description of a specific experimental embodiment is given below for the MR element according to the present invention in order to explain the invention in more detail.

Embodiment 1

Fabrication for Embodiment 1 Sample

A MR effect layer, which functions as a DFL element and is configured with a lamination structure as shown in Table 1 below, was formed.

In the lamination structure of Table 1 below, a read gap length corresponding to a main part of the sensor is 14.6 nm that was a total layer thickness of the first antiferromagnetic coupling intermediate layer (300'), the first ferromagnetic layer (50), the nonmagnetic intermediate layer (40), the second ferromagnetic layer (30), and the second antiferromagnetic coupling intermediate layer (500'). After layers were formed, the lamination structure was processed by a heat treatment at 250° C. for three hours in a magnetic field of 1 tesla (T).

TABLE 1

| Lamination Structure | Layer Material | Layer Thickness (nm) |
| --- | --- | --- |
| Upper Main Shield Layer (5a) | NiFe | 1000 |
| Antiferromagnetic Layer (5b) | IrMn | 7.0 |
| Upper Exchange-Coupling Shield Layer (5c) | CoFe | 1.0 |
| | NiFe | 8.0 |
| | CoFe | 1.0 |
| | Ru | 0.8 |
| | CoFe | 1.0 |
| | NiFe | 8.0 |
| | CoFe | 1.0 |
| Second Antiferromagnetic Coupling Intermediate Layer (500') | Ru | 0.8 |
| Second Ferromagnetic Layer (50) | NiFe | 3.0 |
| | CoFeB | 1.0 |
| | CoFe | 1.0 |
| Nonmagnetic Intermediate Layer (40) | MgO | 3.0 |
| First Ferromagnetic Layer (30) | CoFe | 1.0 |
| | CoFeB | 1.0 |
| | NiFe | 3.0 |
| First Antiferromagnetic Coupling Intermediate Layer (300') | Ru | 0.8 |
| Lower Exchange-Coupling Shield Layer (3c) | CoFe | 1.0 |
| | NiFe | 8.0 |
| | CoFe | 1.0 |
| | Ru | 0.8 |
| | CoFe | 1.0 |
| | NiFe | 8.0 |
| | CoFe | 1.0 |
| Antiferromagnetic Layer (3b) | IrMn | 7.0 |
| Buffer Layer | Ru | 2.0 |
| | Ta | 1.0 |
| Lower Main Shield Layer (3a) | NiFe | 1000 |

The first antiferromagnetic coupling intermediate layer 300' relates to the first lower antiferromagnetic layer. The antiferromagnetic layer 3b relates to the second lower antiferromagnetic layer. The second antiferromagnetic coupling intermediate layer 500' relates to the first upper antiferromagnetic layer. The antiferromagnetic layer 5b relates to the second lower antiferromagnetic layer.

As the side shield layers 7 (see FIG. 1), lamination layers that had specifications described below were formed on the both sides in the width direction (X axis direction) of an element. Namely, the side shield layers 7 were formed with the perpendicular magnetized layers having a total layer thickness of 15.3 nm through alternatively laminating of each of the following two layers: seventeen layers of a $CO_{90}Fe_{10}$ layer having a layer thickness of 0.3 nm, and seventeen layers of a Ni layer having a layer thickness of 0.6 nm.

As the orthogonalizing bias function part 90 (see FIG. 1) that influenced the substantial orthogonalization function of the magnetization directions of the first ferromagnetic layer and the second ferromagnetic layer, a permanent magnet made of CoPt was disposed on the rear part of the MR part shown in Table 1.

In Embodiment 1 Sample, the following items were measured based on isolated reproducing waveforms under the conditions described below: (1) track average amplitude (TAA), (2) resolution, (3) sharpness, and (4) asymmetry-σ (Asym.-σ).

(1) Reproducing Output:TAA
TAA was measured at 63 MHz (⅙ of 380 MHz).

(2) Resolution:
A percentage of the following ratio was measured: TAA at 380 MHz/TAA at 190 MHz.

Namely, the resolution was measured by the following expression:

Resolution=TAA(380 MHz)/TAA(190 MHz)×100(%)

(3) Sharpness:
Reproduced waveforms were obtained through the microtrack profile method. And then, a ratio between a waveform width MRW10 at the 10% point of TAA and a waveform width MRW50 at the 50% point of TAA was calculated and was shown in a percentage (%).

Comparison 1

Fabrication for Comparison 1 Sample

The perpendicular magnetized layer that was the magnetic material for the side shield layers 7 in the fabrication for the embodiment 1 Sample was changed to a single layer of NiFe. Other fabricating conditions were the same as that for the embodiment 1 Sample, and the Comparison 1 Sample was fabricated.

In the Comparison 1 Sample, the same characteristics as the Embodiment 1 did were evaluated. Results were shown in Table 2 below.

Comparison 2

Fabrication for Comparison 2 Sample

The side shield layers 7 in Embodiment 1 were not formed. In other words, the areas corresponding to the side shield layers 7 were replaced with a nonmagnetic material of Cr. Other fabricating conditions and structures were the same as that for the Embodiment 1 Sample, and the Comparison 2 Sample was fabricated.

In the Comparison 2 Sample, the same characteristics as Embodiment 1 did were evaluated. Results were shown in Table 2 below.

Comparison 3

Fabrication for Comparison 3 Sample

The DFL element in the fabrication for the Embodiment 1 Sample was changed to a conventional spin-valve type TMR element. One of ferromagnetic layers was pinned by the antiferromagnetic layer. Another of ferromagnetic layers functioned as a free layer. The orthogonalizing bias function part 90 was not formed because it was not necessary. The side shield layers 7 were changed to bias magnetic layers because of a single magnetic domain of the free layer so that specifications in which a bias magnetic field could be applied were provided.

In the Comparison 3 Sample, the same characteristics as the Embodiment 1 Sample did were evaluated. Results were shown in Table 2 below.

TABLE 2

| Sample No. | Element Structure | Side Shield Layer | Isolated Reproducing Waveforms | | | |
|---|---|---|---|---|---|---|
| | | | TAA | Resolution | Sharpness | Asym.-σ |
| Embodiment 1 | DFL | Perpendicular Magnetized Layer | 14 mV | 48% | 58% | 10% |
| Comparison 1* | DFL | NiFe | 14 mV | 48% | 58% | 14% |
| Comparison 2* | DFL | None | 14 mV | 48% | 52% | 10% |
| Comparison 3* | Spin-Valve TMR | None | 14 mV | 45% | 52% | 10% |

Namely, the sharpness was measured by the following expression:

Sharpness=$MRW50/MRW10$×100(%)

(4) Asym.-σ (asymmetry deviation (σ) of reproduced waveforms):
Asymmetry deviations (Asym.-σ) of the reproduced waveforms were obtained through TAA at 63 MHz.

The larger the value is, the larger deviation the asym.-σ of reproduced waveforms has.

Results were shown in Table 2 below.

It was understood that it was especially important to provide the side shield layers made of the perpendicular magnetized layers on the both sides of the element for improving the asym.-σ in the DFL element structure with two free layers according to the comparison results between Embodiment 1 and Comparison 1 in Table 2. Because the asym.-σ was good in the present invention, it was understood that the magnetization directions of the two free layers normally functioned without any influences from disposition of the side shield layers.

In Comparison 2, the sharpness was poor because there were no side shield layers.

Comparison 3 was an example for reference because the element type was different from one of the present invention.

When comparing Embodiment 1 and Comparison 3, the resolution of the present invention was increased for 3%. This was because the element of the present invention was the DFL element.

According to the experimental results above, an effect of the present invention is apparent.

The MR element of the present invention in a current perpendicular to plane (CPP) structure includes a magnetoresistive effect part (MR part) configured with a nonmagnetic layer, a first ferromagnetic layer that functions as first free layer and a second ferromagnetic layer that functions as a second free layer, and first and second ferromagnetic layers are laminated to sandwich the nonmagnetic intermediate layer, and a sense current flows in a lamination direction of the MR part. An orthogonalizing bias function part, which influences a substantial orthogonalization function for magnetization directions of the first ferromagnetic layer and the second ferromagnetic layer, is formed on the rear side the MR part, side shield layers are disposed on both sides in the width direction of the MR part, the side shield layers are perpendicular magnetized layers with a magnetic shield function, and magnetization directions of the perpendicular magnetized layers are in an orthogonal direction that corresponds to the thickness direction. Accordingly, in a so-called DFL element structure, an extremely superior effect that provides the further high density in the track width direction through the side shield effect while the magnetization direction regulation state of two free layers is held in the normal one in the so-called DFL element structure is provided.

Possibilities for the industrial use of the present invention include its use in a magnetic disk device with an MR element that detects magnetic field intensity as a signal from a magnetic recording medium, and so on.

What is claimed is:

1. A magnetoresistive effect element (MR element) in a current perpendicular to plane (CPP) structure, comprising:
   a magnetoresistive effect part (MR part) configured with a nonmagnetic layer, a first ferromagnetic layer that functions as first free layer and a second ferromagnetic layer that functions as a second free layer, and first and second ferromagnetic layers are laminated to sandwich the nonmagnetic intermediate layer, and a sense current flows in a lamination direction of the MR part, wherein
   an orthogonalizing bias function part, which influences a substantial orthogonalization function for magnetization directions of the first ferromagnetic layer and the second ferromagnetic layer, is formed on the rear side the MR part,
   side shield layers are disposed on both sides in the width direction of the MR part,
   the side shield layers are perpendicular magnetized layers with a magnetic shield function, and magnetization directions of the perpendicular magnetized layers are in an orthogonal direction that corresponds to the thickness direction.

2. The MR element according to claim 1, wherein the perpendicular magnetized layers are configured to include Co and Ni.

3. The MR element according to claim 1, wherein the perpendicular magnetized layers are configured to include Co, Ni and Fe.

4. The MR element according to claim 1, wherein the perpendicular magnetized layers are formed with the multiple-layer structure in which a $Co_xFe_{100-x}$ layer (here, $80 \leq x \leq 100$) and a $Ni_yFe_{100-y}$ layer (here, $80 \leq y \leq 100$) are alternatively laminated as a lamination layer.

5. The MR element according to claim 1, wherein
   the perpendicular magnetized layers are formed with the multiple-layer structure in which a $Co_xFe_{100-x}$ layer (here, $80 \leq x \leq 100$) and a $Ni_yFe_{100-y}$ layer (here, $80 \leq y \leq 100$) are alternatively laminated as a lamination layer, and
   when a layer thickness of the $Co_xFe_{100-x}$ layer is t1, and a layer thickness of the $Ni_yFe_{100-y}$ layer is t2, a thickness ratio satisfies the following expression: $1.5 \leq t2/t1 \leq 2.5$.

6. The MR element according to claim 1, wherein when the influence from the orthogonalizing bias function part is eliminated, the magnetization directions of the first ferromagnetic layer and the second ferromagnetic layer are antiparallel to each other in the width direction.

7. The MR element according to claim 1, wherein
   the first ferromagnetic layer is formed before the second ferromagnetic layer is formed and is disposed on the lower side,
   a lower antiferromagnetic layer, a lower exchange-coupling shield layer, a lower antiferromagnetic layer, and a lower shield layer are sequentially formed toward the bottom under the first ferromagnetic layer, and
   an upper antiferromagnetic layer, an upper exchange-coupling shield layer, an upper antiferromagnetic layer, and an upper shield layer are sequentially formed toward the top above the second ferromagnetic layer.

8. A thin film magnetic head comprising:
   an air bearing surface (ABS) that is opposite to a recording medium;
   the magnetoresistive effect element (MR element) according to claim 1 that is provided in the vicinity of the ABS to detect a signal magnetic field from the recording medium; and
   a pair of electrodes that apply an electric current in the lamination direction of the MR element.

9. A head gimbal assembly comprising:
   a slider having the thin film magnetic head according to claim 8 and being provided opposite to the recording medium; and
   a suspension elastically supporting the slider.

10. A magnetic disk device comprising:
    a slider having the thin film magnetic head according to claim 8 and being provided opposite to the recording medium; and
    a positioning device supporting the slider and locating a position of the slider with respect to the recording medium.

11. A magnetoresistive effect element (MR element) in a current perpendicular to plane (CPP) structure, comprising:
    a magnetoresistive effect part (MR part) configured with a nonmagnetic layer, a first ferromagnetic layer that is configured as first free layer and a second ferromagnetic layer that is configured as a second free layer, and the first and second ferromagnetic layers are laminated to sandwich the nonmagnetic intermediate layer, and a sense current flows in a lamination direction of the MR element;
    an orthogonalizing bias function part that is formed on the rear side the MR part and that applies a bias magnetic field to the first and second ferromagnetic layers so that magnetization directions of the first and second ferromagnetic layers are angled at a predetermined degree with respect to the bias magnetic field; and
    side shield layers that are disposed on the both sides in the width direction of the MR part, wherein
    the side shield layers are configured to shield the MR parts from an external magnetic field and magnetization directions of the side shield layers are in the lamination direction of the MR element.

12. The MR element according to claim 1, wherein
the first ferromagnetic layer is disposed below the nonmagnetic intermediate layer,
a first lower antiferromagnetic layer, a lower exchange-coupling shield layer, a second lower antiferromagnetic layer, and a lower shield layer are sequentially formed in a top-down order under the first ferromagnetic layer.

13. The MR element according to claim 1, wherein
the first ferromagnetic layer is disposed above the nonmagnetic intermediate layer,
a first upper antiferromagnetic layer, an upper exchange-coupling shield layer, a second upper antiferromagnetic layer, and an upper shield layer are sequentially formed in the bottom-up order above the second ferromagnetic layer.

* * * * *